United States Patent
Wu et al.

(10) Patent No.: US 6,764,880 B2
(45) Date of Patent: Jul. 20, 2004

(54) SEMICONDUCTOR PACKAGE AND FABRICATING METHOD THEREOF

(75) Inventors: Chi-Chuan Wu, Taichung (TW); Chien-Ping Huang, Hsinchu (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/456,251

(22) Filed: Jun. 5, 2003

(65) Prior Publication Data

US 2003/0214048 A1 Nov. 20, 2003

Related U.S. Application Data

(62) Division of application No. 10/060,564, filed on Jan. 30, 2002, now Pat. No. 6,590,281.

(30) Foreign Application Priority Data

Nov. 15, 2001 (TW) .......................................... 90128302 A

(51) Int. Cl.[7] ............................................... H01L 21/48
(52) U.S. Cl. ....................................... 438/123; 438/127
(58) Field of Search ................................ 438/106, 121, 438/122, 123, 124, 127, 377, 380; 257/666, 669, 672, 673, 675, 676, 707, 713, 717, 720, 723, 724, 738, 777, 778, 787; 361/704, 709–711, 772–774, 776, 813; 29/841, 855, 856

(56) References Cited

U.S. PATENT DOCUMENTS

| | | |
|---|---|---|
| 5,869,894 A | 2/1999 | Degani et al. |
| 6,184,580 B1 | 2/2001 | Lin |
| 6,198,171 B1 | 3/2001 | Huang et al. |
| 6,287,892 B1 | 9/2001 | Takahashi et al. |
| 6,365,963 B1 | 4/2002 | Shimada |
| 6,369,448 B1 | 4/2002 | McCormick |
| 6,399,423 B2 | 6/2002 | Matsuura et al. |
| 6,414,385 B1 * | 7/2002 | Huang et al. ............... 257/690 |
| 6,509,642 B1 | 1/2003 | Cohn |
| 6,590,281 B2 * | 7/2003 | Wu et al. ................... 257/684 |
| 2002/0004258 A1 | 1/2002 | Nakayama et al. |
| 2002/0027275 A1 | 3/2002 | Fujimoto et al. |
| 2002/0043717 A1 | 4/2002 | Ishida et al. |
| 2003/0001252 A1 | 1/2003 | Ku et al. |

* cited by examiner

Primary Examiner—Alonzo Chambliss
(74) Attorney, Agent, or Firm—Peter F. Corless; Steven M. Jensen; Edwards & Angell, LLP

(57) ABSTRACT

A QFN semiconductor package and a fabrication method thereof are proposed, wherein a lead frame having a plurality of leads is adopted, and each lead is formed at its inner end with a protruding portion. A wire bonding region and a bump attach region are respectively defined on opposite surfaces of the protruding portion, and staggered in position. This allows a force applied from a wire bonder to the wire bonding regions not to adversely affect solder bumps implanted on the bump attach regions, so that the solder bumps can be structurally assured without cracking. Moreover, the wire bonding regions spaced apart from the bump attach regions can be prevented from being contaminated by an etching solution used in solder bump implantation, so that wire bonding quality can be well maintained.

10 Claims, 5 Drawing Sheets

US 6,764,880 B2

SEMICONDUCTOR PACKAGE AND FABRICATING METHOD THEREOF

CROSS-REFERENCE TO RELATED APPLICATION(S)

This application is a divisional of application U.S. Ser. No. 10/060,564, filed on Jan. 30, 2002, U.S. Pat. No. 6,590,281.

FIELD OF THE INVENTION

This invention relates to semiconductor packages and fabrication methods thereof, and more particularly, to a quad flat non-lead (QFN) semiconductor package and a method for fabricating the same.

BACKGROUND OF THE INVENTION

Highly integrated semiconductor packages tend to be decreasingly sized and cost-effectively fabricated in compliance for use with low-profile electronic products. For example of a lead frame based semiconductor package, however, relatively long wire loops and occupied space above the lead frame by gold wires for electrically connecting a chip to the lead frame, may undesirably set certain restriction to dimensional reduction for the package.

In favor of profile miniaturization, U.S. Pat. No. 6,198, 171 discloses an QFN (quad flat non-lead) semiconductor package. Referring to FIG. 1, this QFN semiconductor package 1 adopts a lead frame 10 having a die pad 11 and a plurality of leads 12 surrounding the die pad 11, wherein by using half-etching or punching technique, each of the leads 12 is formed at its inner end 122 with a protruding portion 123 that is dimensioned smaller in thickness than the rest part of the lead 12. A chip 14 is mounted on the die pad 11 in an upside-down manner that, an active surface 140 of the chip 14 faces downwardly to be in contact with the die pad 11. A plurality of gold wires 180 are formed to electrically connect the active surface 140 of the chip 14 to the protruding portions 123 of the leads 12. And, an encapsulant 19 encapsulates the die pad 11, the chip 14, the gold wires 180 and a cavity formed underneath the protruding portions 123 of the leads 12.

Due to reduced thickness of the protruding portions 123 of the leads 12, the cavity formed underneath the protruding portions 123 allows to receive the gold wires 180 for use in chip-lead frame electrical connection. With the chip 14 being mounted with its active surface 140 facing toward the cavity, only considerably short gold wires 180 are required to achieve satisfactory electrical connection, making electric transmission and performances of the semiconductor package 1 significantly improved. Moreover, since the gold wires 180 are retained under the leads 12, space above the chip 14 can be more efficiently used for accommodating more chips (as shown in FIG. 2), so as to desirably enhance functionality and processing speed of packaged products.

FIG. 2 illustrates a more advanced multi-chip semiconductor package 1. As shown in the drawing, this multi-chip semiconductor package 1 is characterized in the stacking of a larger second chip 15 on a first chip 14, with an active surface 150 of the second chip 15 being partly in contact with the first chip 14. In order to reduce wire bonding complexity and improve electrical quality, a plurality of solder bumps 16 are formed on the active surface 150 of the second chip 15, for electrically connecting the second chip 15 to top surfaces 120 of the protruding portions 123 of the leads 12.

During fabrication of the foregoing multi-chip package 1, the second chip 15 mounted on the first chip 14 is firstly electrically connected to the protruding portions 123 of the leads 12 by means of the solder bumps 16, and then a wire bonding process is performed for the first chip 14. However, as shown in FIG. 3, when a wire bonder 18 moves to wire contacts 124 of the leads 12 and forms gold wires 180, it applies a force to the wire contacts 124, which force would be in turn transferred to the solder bumps 16 implanted opposite to the wire contacts 124, thereby making the solder bumps 16 crack and even damaging electrical connection quality of the second chip 15.

SUMMARY OF THE INVENTION

A primary objective of the present invention is to provide a QFN semiconductor package and a fabrication method thereof, in which wire bonding regions are staggered in position with bump attach regions of a lead frame, whereby solder bumps implanted on the bump attach regions can be prevented from being damaged by force-induced cracks.

Another objective of the present invention is to provide a QFN semiconductor package and a fabrication method thereof, in which wire bonding regions are staggered in position with bump attach regions of a lead frame, whereby the wire bonding regions can be prevented from being contaminated by an etching solution used in solder bump implantation, allowing wire bonding quality to be well assured.

In accordance with the above and other objectives, the present invention proposes a QFN semiconductor package, comprising: a lead frame having a plurality of leads, each of the leads being formed at an inner end thereof with a protruding portion that is dimensioned smaller in thickness than rest part of the lead, wherein the protruding portion has at least a first surface and a second surface opposed to the first surface, and at least a first bonding region is defined on the first surface and staggered in position with a second bonding region formed on the second surface; at least a first semiconductor chip having an active surface and a non-active surface opposed to the active surface, wherein the active surface faces downwardly and is connected to the first bonding regions by a plurality of bonding wires, so as to allow the first semiconductor chip to be electrically coupled to the leads; at least a second semiconductor chip having an active surface and a non-active surface opposed to the active surface, and mounted on the first semiconductor chip, wherein the active surface is electrically connected to the second bonding regions by a plurality of solder bumps; and an encapsulant for encapsulating the first and second semiconductor chips, the bonding wires and the solder bumps.

The invention is characterized in the forming of a protruding portion that is dimensioned smaller in thickness and positioned at an inner end of each lead, wherein a wire bonding region and a bump attach region are defined on opposite surfaces of the protruding portion and staggered in position. By such stagger arrangement, during wire bonding, a force applied by a wire bonder to the wire bonding regions of the protruding portions would not adversely affect solder bumps implanted on the bump attach regions, so that the solder bumps can be structurally assured without cracking. Moreover, the wire bonding regions are distantly spaced apart from the bump attach regions, and not easily contaminated by an etching solution such as flux or acid-base rinsing solution used in solder bump implantation, thereby making the wire bonding quality well maintained.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENT

The following description is made with reference to FIGS. 4 to 7 for depicting preferred embodiments of a QFN semiconductor package proposed in the present invention. For the sake of clarification, a dual-chip semiconductor package is exemplified. It is understood that, the fabrication method of the invention is suitably applied to various lead frame based semiconductor packages, in which three or more chips can be accommodated in the semiconductor devices without altering the package profile.

First Preferred Embodiment

Figure 1:
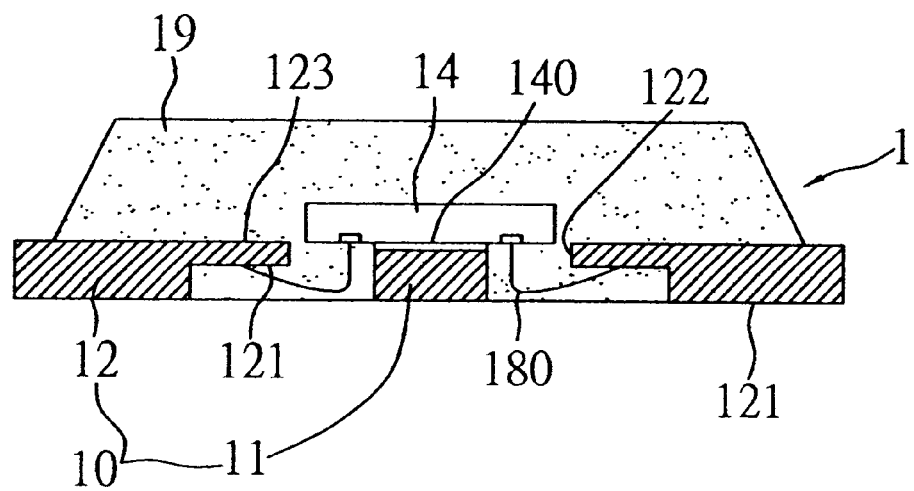
FIG. 1 (PRIOR ART) is a cross-sectional view of a QFN semiconductor package disclosed in U.S. Pat. No. 6,198, 171.
Figure 2:
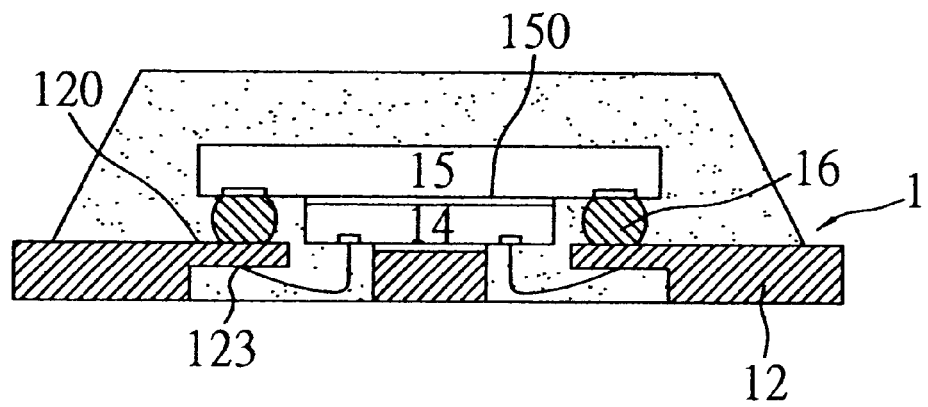
FIG. 2 (PRIOR ART) is a cross-sectional view of a conventional multi-chip semiconductor package.
Figure 3:
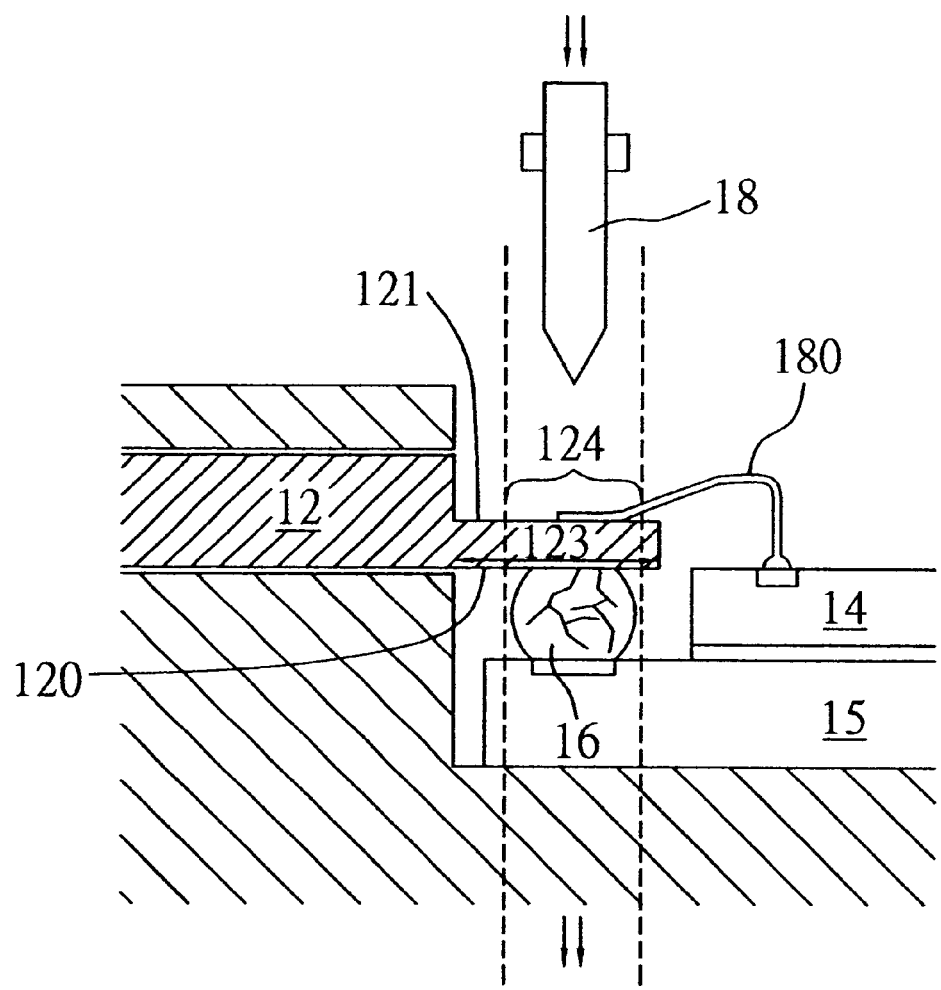
FIG. 3 (PRIOR ART) is a partly magnified view illustrating a wire bonding process of the conventional semiconductor package in FIG. 2.
Figure 4:
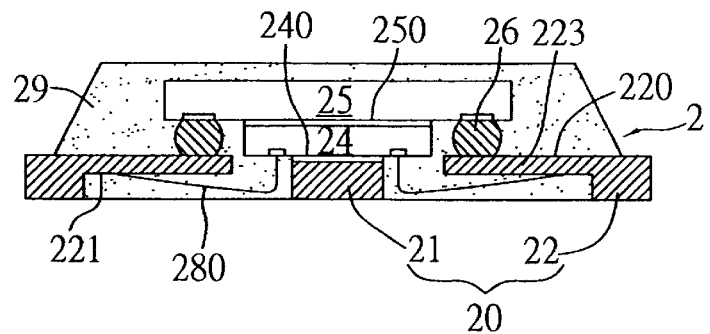
FIG. 4 is a cross-sectional view of a QFN semiconductor package of a first preferred embodiment of the invention.

FIG. 4 illustrates a QFN semiconductor package of the first embodiment of the invention. As shown in the drawing, this semiconductor package 2 comprises: a lead frame 20 having a centrally-positioned die pad 21 and a plurality of leads 22 surrounding the die pad 21, wherein each of the leads 22 is formed at its inner end toward the die pad 21 with a protruding portion 223 that is dimensioned smaller in thickness than the rest part of the lead 22; a first chip 24 mounted on the die pad 21 in an upside-down manner that, an active surface 240 of the first chip 24 faces downwardly to be in contact with the die pad 21; a second chip 25 formed with a plurality of metallic solder bumps 26 on an active surface 250 thereof, allowing the second chip 25 to be electrically connected to top surfaces 220 of the protruding portions 223; a plurality of gold wires 280 for electrically connecting the first chip 24 to bottom surfaces 221 of the protruding portions 223, wherein positions formed with the gold wires 280 on the bottom surfaces 221 of the protruding portions 223, are staggered with those for implanting the solder bumps 26 on the top surfaces 220 of the protruding portions 223; and an encapsulant 29 for encapsulating the first and second chips 24, 25, wherein the bottom surfaces of the leads 22 are partly exposed to outside of the encapsulant 29.

A fabrication method of the QFN semiconductor package of the invention is described with reference to FIGS. 5A to 5D as follows.

Figure 5A:
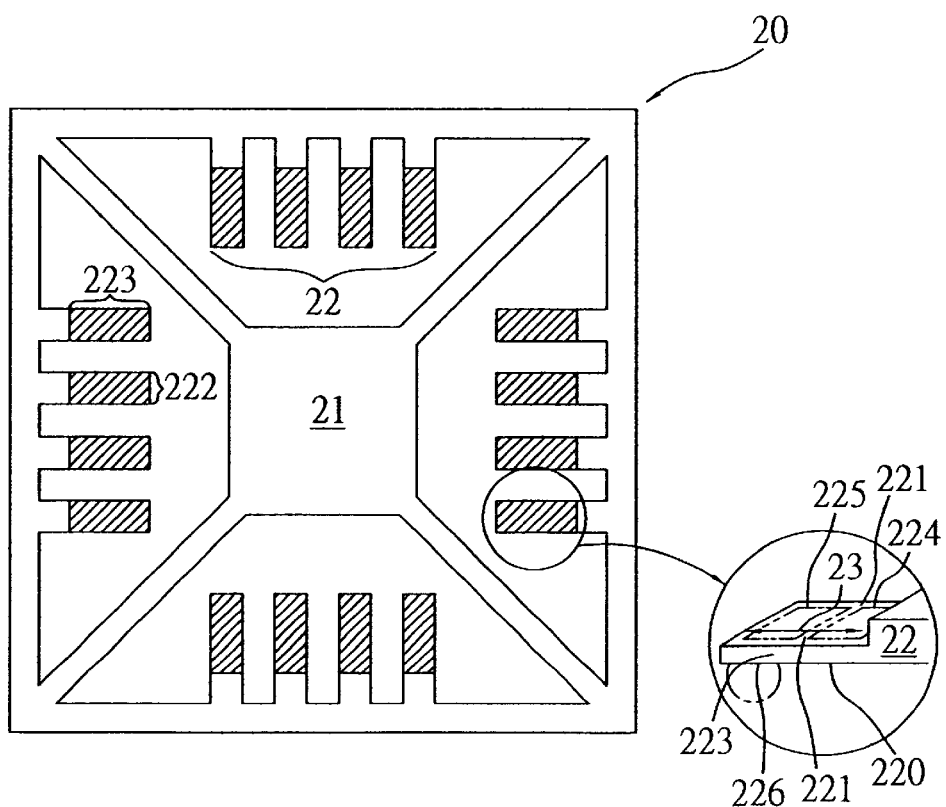
FIGS. 5A–5D are schematic diagrams illustrating the steps involved in a fabrication method of a QFN semiconductor package of a first preferred embodiment of the invention.

Referring to FIG. 5A, the first step is to prepare a lead frame 20 made of a metallic material such as copper or copper alloy. The lead frame 20 is composed of a die pad 21 and a plurality of leads 22 surrounding the die pad 21. By using half-etching or punching technique, each of the leads 22 is formed at its inner end toward the die pad 21 with a protruding portion 223 that is dimensioned smaller in thickness than the rest part of the lead 22, allowing to form a cavity 23 underneath the protruding portions 223 for receiving gold wires (not shown, described later). Further, each of the protruding portions 223 has a top surface 220 and a bottom surface 221, and is sufficiently dimensioned in a manner that, the bottom surface 221 thereof is pre-defined with a wire bonding region 224 and a bump corresponding region 225 not in overlap with the wire bonding region 224. The bump corresponding region 225 is vertically aligned with a bump attach region 226 formed on the top surface 220 of the protruding portion 223, making the bump attach region 226 staggered in position with the wire bonding region 224.

Figure 5B:
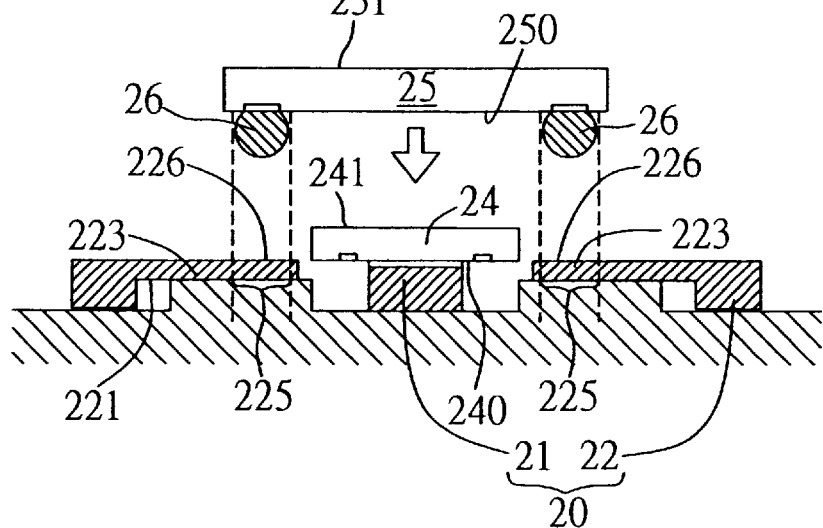

Referring to FIG. 5B, the next step is to prepare a first chip 24 and a second chip 25, wherein each of the chips 24, 25 has an active surface 240, 250 (i.e. a surface disposed with a plurality of electronic circuits and electronic elements thereon) and a non-active surface 241, 251 opposed to the active surface 240, 250. A plurality of metallic solder bumps 26 are pre-implanted on the active surface 250 of the second chip 25, and used for electrically connecting the second chip 25 to the leads 22. After the first chip 24 with its active surface 240 facing downwardly is mounted on the die pad 21, an adhesive layer (not shown) can be applied over the non-active surface 241 of the first chip 24 for adhering the second chip 25 on the first chip 24 in a manner that, the solder bumps 26 implanted on the second chip 25 are bonded to the bump attach regions 226 on the protruding portions 223 of the leads 22.

Figure 5C:
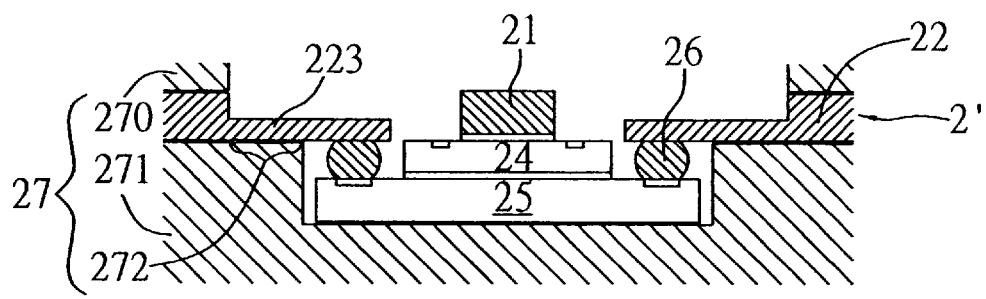

Referring further to FIG. 5C, the semi-fabricated semiconductor structure 2' is inverted to be placed and clamped in a jig 27, and preheated. The jig 27 is composed of an upper part 270 and a lower part 271 engageable with the upper part 270. The lower part 271 is formed with a flat extending portion 272 corresponding in position to the protruding portions 223 of the leads 22, so as to firmly hold the protruding portions 223 in position and prevent the leads 22 from being shifted or dislocated.

Figure 5D:
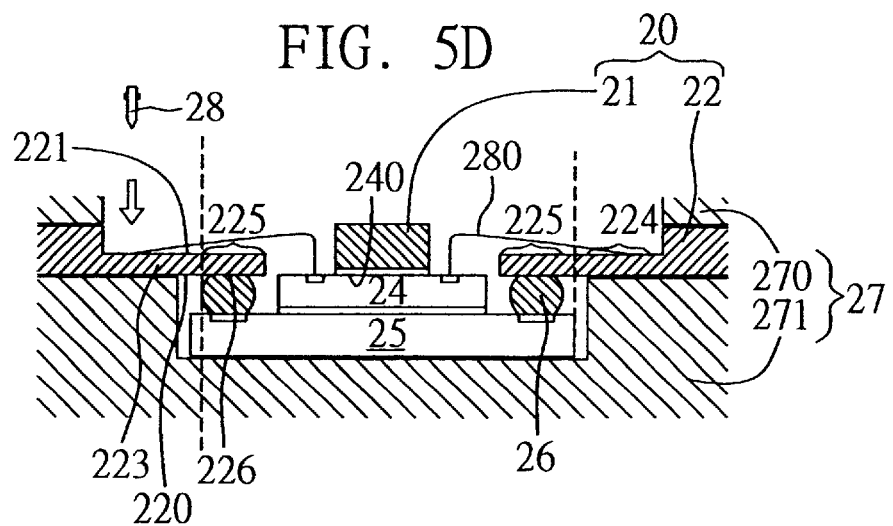

Finally, referring to FIG. 5D, a wire bonding process is performed, in which a conventional wire bonder 28 is adopted to form a plurality of gold wires 280 that extends from the active surface 240 of the first chip 24 to the wire bonding regions 224 on the bottom surfaces 221 of the protruding portions 223.

Since the wire bonding regions 224 are staggered in position with the bump attach regions 226 on the top surfaces 220 of the protruding portions 223, a force applied by the wire bonder 28 to the wire bonding regions 224 would not adversely affect the solder bumps 26 implanted on the bump attach regions 226, whereby the solder bumps 26 can be structurally assured without cracking. Moreover, the wire bonding regions 224, properly spaced apart from the bump attach regions 226, are not easily contaminated by an etching solution such as flux and acid-base rinsing solution used in solder bump implantation. This therefore helps maintain wire bonding quality between the gold wires 280 and the wire bonding regions 224. In addition, the protruding portions 223 are made through the use of currently available technology and equipment, without leading to extra increase in fabrication costs for the lead frame 20.

Second and Third Preferred Embodiment

Figure 6:
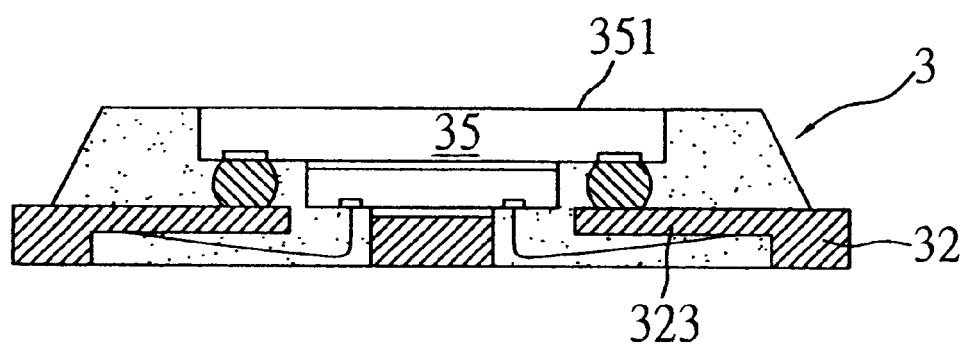
FIG. 6 is a cross-sectional view of a QFN semiconductor package of a second preferred embodiment of the invention.
Figure 7:
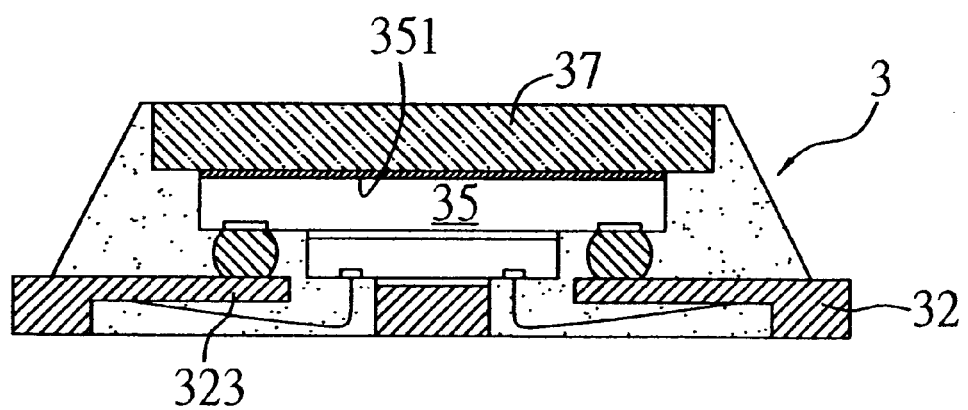
FIG. 7 is a cross-sectional view of a QFN semiconductor package of a third preferred embodiment of the invention.

FIGS. 6 and 7 illustrate the other two preferred embodiments of the semiconductor package of the invention. As shown in the drawing, this semiconductor package 3 is largely the same as that of the first embodiment, except that a non-active surface 351 of a second chip 35 is here directly exposed to the atmosphere (as shown in FIG. 6), or an additional heat sink 37 is provided on the second chip 35 (as shown in FIG. 7). With the forming of protruding portions 323, leads 32 are reduced in exposed area for heat dissipation, and therefore, the exposed non-active surface 351 of the second chip 35 or the provision of the heat sink 37 allows to improve overall heat dissipating efficiency of the semiconductor package 3, and assure the chip functionality in a dual-chip (or multi-chip) semiconductor package.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a semiconductor package, comprising the steps of:

preparing a lead frame having a plurality of leads, each of the leads being formed at an inner end thereof with a protruding portion that is dimensioned smaller in thickness than the rest part of the lead, wherein the protruding portion has at least a first surface and a second surface opposed to the first surface, and at least a first bonding region is defined on the first surface and staggered in position with a second bonding region formed on the second surface;

preparing at least a first semiconductor chip and a second semiconductor chip, and electrically connecting the second semiconductor chip to the second bonding regions by a plurality of conductive elements, wherein the second semiconductor chip is mounted on the first semiconductor chip;

placing the lead frame mounted with the first and second semiconductor chips into a jig, and forming a plurality of bonding wires for electrically connecting the first semiconductor chip to the first bonding regions; and forming an encapsulant for encapsulating the first and second semiconductor chips, the bonding wires and the conductive elements.

2. The fabrication method of claim 1, wherein the semiconductor package is a QFN (quad flat non-lead) semiconductor package.

3. The fabrication method of claim 1, wherein the protruding portions with smaller thickness form a cavity underneath the first surfaces of the protruding portions for receiving the bonding wires.

4. The fabrication method of claim 1, wherein the first surface of the protruding portion is further defined with a bump corresponding region that is vertically aligned in position with the second bonding region.

5. The fabrication method of claim 4, wherein the bump corresponding region is free of overlap with the first bonding region on the first surface of the protruding portion.

6. The fabrication method of claim 1, wherein the conductive elements are solder bumps.

7. The fabrication method of claim 1, wherein the jig is composed of an upper part and a lower part opposed to the upper part, and the lower part is formed with a flat extending portion corresponding in position to the leads for supporting the protruding portions thereon.

8. The fabrication method of claim 1, wherein the bonding wires are bonded to the first bonding regions by using a wire bonder.

9. The fabrication method of claim 8, wherein the wire bonder applies a force to the first bonding regions.

10. The fabrication method of claim 1, further comprising a step of: mounting a heat sink on the second semiconductor chip.

* * * * *